United States Patent
Hanamachi et al.

(10) Patent No.: US 7,241,346 B2
(45) Date of Patent: Jul. 10, 2007

(54) APPARATUS FOR VAPOR DEPOSITION

(75) Inventors: Toshihiko Hanamachi, Yokohama (JP); Toshihiro Tachikawa, Yokohama (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 112 days.

(21) Appl. No.: 10/696,519

(22) Filed: Oct. 29, 2003

(65) Prior Publication Data
US 2004/0194710 A1    Oct. 7, 2004

(30) Foreign Application Priority Data
Oct. 29, 2002    (JP)    ............................. 2002-314378

(51) Int. Cl.
*H01L 21/00* (2006.01)
*C23C 16/00* (2006.01)
*C23C 14/00* (2006.01)

(52) U.S. Cl. ................. 118/725; 118/728; 118/724; 118/733; 156/345.52; 219/444.1; 361/234; 279/128

(58) Field of Classification Search ................. 118/725, 118/728, 724; 156/345.52; 219/444.1, 514; 204/192.1, 298.01; 361/234; 279/128
See application file for complete search history.

(56) References Cited

U.S. PATENT DOCUMENTS

| | | | |
|---|---|---|---|
| 5,044,311 A * | 9/1991 | Mase et al. ............... | 118/723 E |
| 5,231,690 A | 7/1993 | Soma et al. ................ | 392/416 |
| 5,618,350 A | 4/1997 | Ishikawa et al. ............ | 118/725 |
| 5,688,331 A * | 11/1997 | Aruga et al. ................ | 118/725 |
| 5,994,251 A * | 11/1999 | Niwa .......................... | 501/127 |
| 6,494,955 B1 | 12/2002 | Lei et al. ..................... | 118/715 |
| 2001/0055190 A1 | 12/2001 | Saito et al. ................. | 361/234 |

(Continued)

FOREIGN PATENT DOCUMENTS

JP    7-153706    6/1995

(Continued)

OTHER PUBLICATIONS

Korean Office Action dated Aug. 25, 2005 corresponding to Korean Application No. 10-2003-0075540.

(Continued)

*Primary Examiner*—Ram N. Kackar
(74) *Attorney, Agent, or Firm*—Ohlandt, Greeley, Ruggiero & Perle, L.L.P.

(57) ABSTRACT

A stage has a plate, a first seal surface, a stem, a second seal surface, a cover, a conductor and a flow path. A heater is embedded in the plate. A terminal for supplying power to the heater is exposed at one surface of the plate. The first seal surface is provided on the plate, shaped like a ring and surrounds the terminal. The stem is shaped like a hollow cylinder, surrounds the terminal and supports the plate. The second seal surface is provided on that end of the stem which supports the plate, and is shaped like a ring. The cover closes an open end of the stem, which is opposite to the end which supports the plate. The conductor passes through the cover into the stem and is connected to the terminal. The flow path is provided in the cover, for supplying inert gas into the stem at a pressure equal to or higher than the pressure of process gas present outside the stem.

13 Claims, 4 Drawing Sheets

U.S. PATENT DOCUMENTS

2002/0185487 A1* 12/2002 Divakar et al. .......... 219/444.1

FOREIGN PATENT DOCUMENTS

| JP | 8218172 | 8/1996 |
| JP | 3131010 | 11/2000 |
| JP | 2001298020 | 10/2001 |
| JP | 2001345370 | 12/2001 |
| JP | 2002110547 | 4/2002 |
| JP | 2002118098 | 4/2002 |
| KR | 2001-0113558 | 12/2001 |

OTHER PUBLICATIONS

Translation of Korean Office Action dated Aug. 25, 2005 corresponding to Korean Application No. 10-2003-0075540.

Japanese Office Action dated Nov. 14, 2006 based on the Japanese Patent Application No. 2002-314378.

* cited by examiner

APPARATUS FOR VAPOR DEPOSITION

CROSS-REFERENCE TO RELATED APPLICATIONS

This application is based upon and claims the benefit of priority from the prior Japanese Patent Application No. 2002-314378, filed Oct. 29, 2002, the entire contents of which are incorporated herein by reference.

BACKGROUND OF THE INVENTION

1. Field of the Invention

The present invention relates to a stage for holding a wafer in a process gas atmosphere during, for example, a process of manufacturing a semiconductor device.

2. Description of the Related Art

Various processes, such as CVD (Chemical Vapor Deposition), PVD (Plasma Vapor Deposition) and etching, are performed in a process of manufacturing a semi-conductor device. Among the devices used in these processes are stages that hold a disc-shaped semiconductor wafer cut from an ingot. Each stage has a plate and a stem. The plate equips a heater or a high-frequency electrode. The stem supports the plate. The heater or high-frequency electrode is connected to a lead wire. The lead wire extends through the stem, which is formed a hollow cylinder.

The plate and the stem are exposed to a fluoric gas atmosphere and heated by the heater. In view of this, they are made of ceramics such as aluminum nitride. The plate (susceptor block) and the stem (support base) are secured to each other by screws. Refer to, for example, Jpn. Pat. Appln. KOKAI Publication 7-153706 (paragraphs 0032 to 0034, and FIG. 4). To prevent the lead line from being corroded by the process gas, such as fluoric gas, leaking out at the fitting portion between the plate and the stem, inert gas such as argon gas is introduced into the stem at a pressure higher than the pressure of the ambient gas.

Semiconductor wafer heaters are known which have a hollow cylindrical member (stem) and a ceramics heater (plate). Such a wafer heater is disclosed in Japanese Patent No. 3131010 (see paragraphs 0007, 0008 and 0014, and FIG. 1). The hollow cylindrical member has a flange at one end. The ceramics heater has a resistance heater embedded and terminals exposed at the back. The semiconductor wafer heater has an annular member provided between the flange and the back. The annular member is shaped like an O-ring and made of soft metal. A support member is hooked on the flange formed on the outer periphery of the ceramics heater. A holding plate is hanged on the hollow cylindrical member. Bolts fasten the support member and the holding plate together. They apply a load at the fitting portion between the hollow cylindrical member and the ceramics heater. The fitting portion is thereby sealed airtight. The hollow cylindrical member and the ceramics heater are discrete units. Thus, one of them can be separated from the other if cracks have developed in it and can be replaced by a new one. The soft metal, i.e., the material of the annular member, is platinum.

If the susceptor block and the support base are directly fastened with blots, however, the inert gas may leak from inside through the gap between the susceptor block and the support base. Further, the heat of the heater may be conducted through the fitting portion, causing a heat loss. A temperature difference may occur on the surface of the susceptor block. If a temperature difference occurs, the process conditions for manufacturing the semiconductor device becomes unstable. In some cases, the susceptor block may be broken due to a thermal stress.

If a platinum O-ring for annular member is inserted and maintains airtight between the ceramics heater and the hollow cylindrical member, the interior of the hollow cylindrical member will be exposed to the atmosphere. Therefore, heat may easily radiate, and the terminals or conductors may be readily oxidized. Since the ceramics hater is held by the support member at its outer periphery, it may be bent, particularly when its outer periphery is remote from the annular member. This decreases the flatness of the ceramics heater and impairs the sealing between the ceramics heater and the annular member. Since the ceramics heater and the hollow cylindrical member have different thermal expansion coefficients, the fitting portion between them may become less airtight than desired. Inevitably, a complex mechanism must be used to exert a stable force that pushes the ceramics heater and hollow cylindrical member to the annular member.

BRIEF SUMMARY OF THE INVENTION

This invention provides a stage that is simple in structure, can reduce a heat loss at the plate and can protect the metal components such as terminals from process gas that may every likely corrode the metal components.

A stage according to the invention comprises a plate, a first seal surface, a stem, a second seal surface, a cover, a conductor and a flow path. A heater is embedded in the plate and generates heat by resistance heating. A terminal for supplying power to the heater is exposed at one surface of the plate. The first seal surface is provided on the plate, shaped like a ring and surrounds the terminal. The stem is shaped like a hollow cylinder, surrounds the terminal and supports the plate. The second seal surface is provided on that end of the stem that supports the plate, and is shaped like a ring. The cover closes an open end of the stem, which is opposite to the end that supports the plate. The conductor passes through the cover into the stem and is connected to the terminal. The flow path is provided in the cover, for supplying inert gas into the stem.

In the stage according to this invention, the first and second seal surfaces are provide at the fitting portion between the plate and the stem. The inert gas is supplied into the stem, at a pressure equal to or higher than the pressure of process gas. Therefore, the metal components such as the terminal and the conductor are not exposed to the process gas. Since the plate and stem have a seal surface each, the amount of the inert gas flowing into the process chamber through the gap between the plate and the stem can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

DETAILED DESCRIPTION OF THE INVENTION

Figure 1:
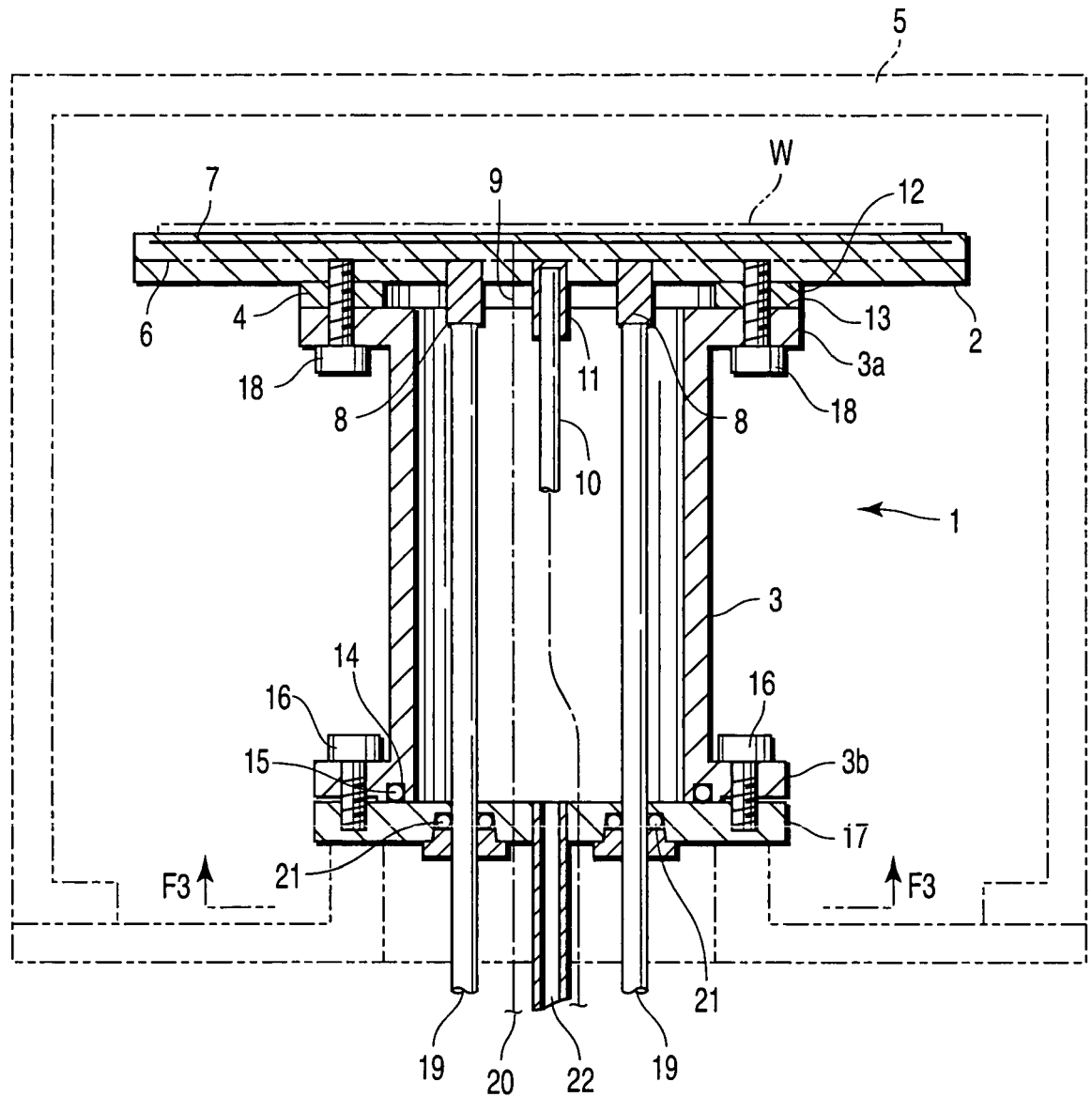
FIG. 1 is a sectional view showing a stage according to a first embodiment of the present invention.
Figure 2:
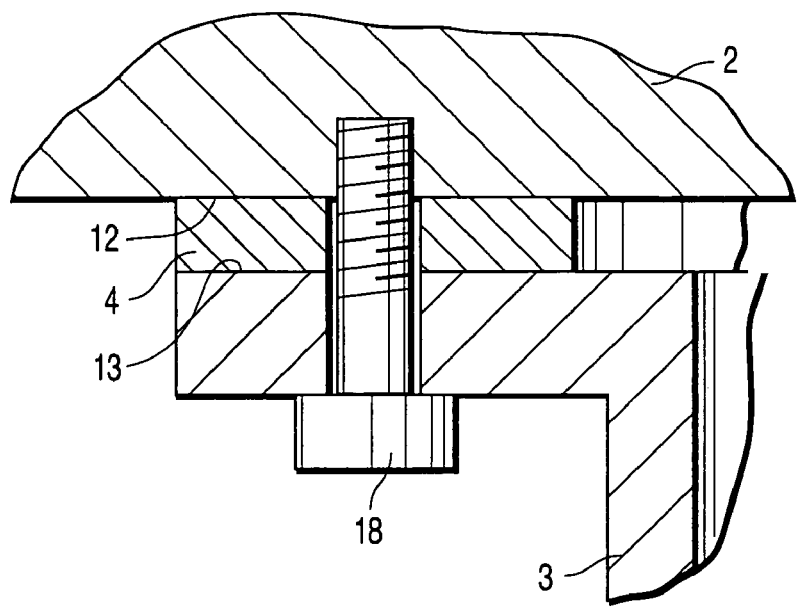
FIG. 2 is a magnified sectional view illustrating the fitting portion between the plate and stem of the stage shown in FIG. 1.
Figure 3:
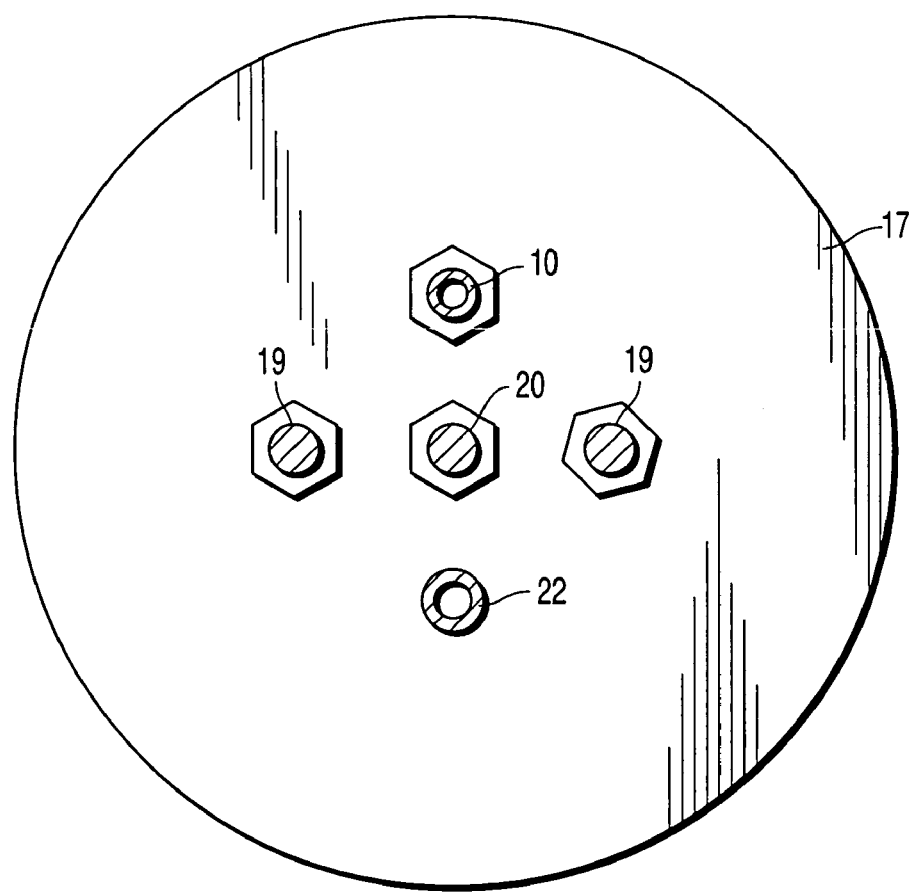
FIG. 3 is a sectional view of the cover for the stage, taken along line F3-F3 shown in FIG. 1.

A stage 1, which is a film-forming apparatus according to the first embodiment of this invention, will be described with reference to FIGS. 1 to 3. As FIG. 1 shows, the stage 1 has a plate 2, a stem 3 and a seal ring 4. A wafer W is held on the plate 2 of the stage 1. The stage 1 is set within a process chamber 5. It is exposed to the process gas used in each process while holding the wafer W. The process gas is supplied at a predetermined pressure into the chamber 5 through a supply path (not shown).

The plate 2 is made of ceramic. A heater 6 and an electrode 7 are embedded in the plate 2. The heater 6 generates heat by virtue of resistance heating. It is desired that the heater 6 be made of metal that excels in heat resistance and has a small thermal expansion coefficient or a thermal expansion coefficient similar to that of the ceramic, i.e., the material of the plate 2. More specifically, the metal for the heater 6 may be molybdenum, tungsten or the like. Terminals 8 for supplying power to the heater 6 are exposed at one surface of the plate 2, or the lower surface as shown in FIG. 1. The electrode 7 is a ground electrode that is used when a plasma process is performed on the wafer W. It is embedded in the surface on which the wafer W is held. The electrode 7 is connected to a terminal 9 that is exposed at the lower surface of the plate 2, at which the terminals 8 of the heater 6 are provided. A socket 11 for insertion a thermocouple 10 to control the temperature of the heater 6, is secured to that surface of the plate 2 at which the terminals 8 and 9 are provided. The thermocouple 10 may be secured directly to the plate 2. A first seal 12 is annularly formed on the plate 2, surrounding the terminals 8 for the heater 6 and the terminal 9 for the electrode 7. The first seal has polished flat surfaces.

The stem 3 is made of the same ceramic as the plate 2. The stem 3 is shaped like a hollow cylinder. It has a diameter large enough to surround the terminals 8 for the heater 6, the terminal 9 for the electrode 7, and the thermocouple 10. The stem 3 has flanges 3a and 3b at the ends, respectively. A second seal 13 is formed on the flange 3a that faces the plate 2. The flange 3b has an O-ring groove 14. The second seal has polished flat surfaces. An O-ring 15 is fitted in the O-ring groove 14. A cover 17 is fastened to the flange 3b by screws 16.

The seal ring 4 is made of ceramic that excels in adiabatic property and has a higher resistance to heat conduction than the plate 2 and stem 3. The seal ring 4 is interposed between the first seal 12 formed on the plate 2 and the second seal 13 formed on the flange 3a of the stem 3. As FIG. 2 shows, screws 18, or fastening members that fasten the plate 2 and the stem, pass through the seal ring 4. The screws 18 are made of ceramic, in consideration of the thermal expansion of the heater 6. Made of ceramic, the screws 18 can reduce the amount in which heat radiates. The outer surfaces of the seal ring 4 are polished, providing seal surfaces.

Conductors 19 are connected to the terminals 8 for the heater 6 and a conductor 20 is connected to the terminal 9 for the electrode 7, by means of, for example, soldering. As FIG. 3 depicts, the conductors 19 and 20 thus connected are led out from the process chamber 5 through the cover 17. The thermocouple 10 is inserted into the socket 11 as is illustrated in FIG. 1. It is led from the process chamber 5 through the cover 17, in the same way as the conductors 19 and 20. A packing, such as an O-ring 21, is set in the gap between each conductor 19 and 20 and the cover 17, and a bush or the like is applied, providing airtight sealing. Similarly, a packing, such as an O-ring 21, is set in the gap between the thermocouple 10 and the cover 17, and a bushing or the like is applied, providing airtight sealing.

A flow path 22 is coupled to the cover 17 to supply inert gas into the stem 3. A pressure-adjusting valve (not shown) and a flow-rate-adjusting valve (not shown) are provided on the flow path 22. A bombe filled with the inert gas is also connected to the flow path 22. The inert gas is supplied into the stem 3 at a pressure either equal to or higher than the pressure at which process gas is supplied into the process changer 5. Hence, no process gas will flow into the stem 3. The conductors 19, conductor 20, thermocouple 10 and flow path 22 are arranged as shown in FIG. 3. This arrangement is no more than an example. The flow path 22 may be positioned in the center. An exhaust path may be provided to discharge gas from the stem 3.

The plate 2, stem 3, seal ring 4 and screws 18 are made of ceramic. The plate 2 and the screws 18 have almost the same linear expansion coefficient. Thus, the screw thread will not be broken when the heater 6 raises the temperatures of the plate 2 and screws 18. The stem 3 and the seal ring 4 have a linear thermal expansion coefficient larger than or equal to those of the plate 2 and screws 18. Thus, they prevent the first and second seals 12 and 13 from being spaced apart from the seal ring 4 when the temperature of the heater 6 rises.

The stage 1 thus configured is connected to a control apparatus (not shown). In the process chamber 5, the stage 1 heats the wafer W in order to promote the reaction between the wafer W and the process gas. The control device detects the temperature of the plate 2 by using the thermocouple 10, and controls the current to be supplied to the heater 6. The control apparatus monitors the pressure of the process gas being supplied into the process chamber 5 and the pressure of the inert gas being supplied into the stem 3. The control device controls the supply of the inert gas from the flow path 22 so that the pressure in the stem 3 may become equal to or hither than the pressure in the process chamber 5.

The stage 1 has the seal ring 4 that is interposed between the plate 2 and the stem 3 and made of ceramic having excellent adiabatic property. Hence, the loss of heat from the plate 2 is suppressed. As a result, a non-uniform temperature distribution will not occur in the plate 2. This not only prevents the plate 2 from being broken due to a thermal stress, but also stabilizes the temperature of the wafer W heated. Since the inert gas is supplied into the stem 3 at a pressure equal to or hither than the pressure of the process gas, the process gas would not flow into the stem 3. In the stage 1 having the configuration described above, it is possible to prevent the terminals 8 and 9, conductors 19 and 20 and thermo-couple 10 from being exposed to the process gas. The stage 1 having the above-described configuration is therefore suitable for use in an atmosphere of process gas that greatly corrodes metals. Since the inert gas is supplied into the stem 3, the terminals 8 and 9, conductors 19 and 20 and thermocouple 10 can be prevented from being oxidized due to the heat of the plate 2.

The first seal surface 12 of the plate 2, the second seal surface 13 of the stem 3 and both sides of the seal ring 4 are polished. They contact one another, at parts having some width. This minimizes the amount in which the inert gas leaks into the process chamber 5.

Figure 4:
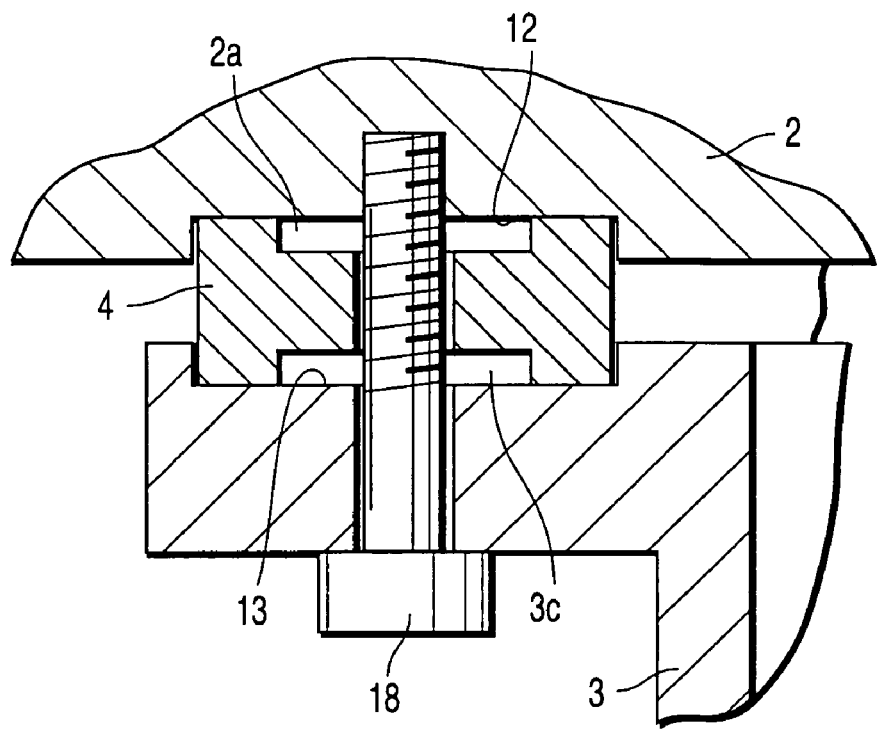
FIG. 4 is a magnified sectional view showing the fitting portion between the plate and stem of a stage according to a second embodiment of the invention.

FIG. 4 shows the fitting portion between the plate 2 and stem 3 of a stage 1, which is a film-forming apparatus according to the second embodiment of the invention. This stage 1 is basically the same as the stage 1 of the first embodiment in other structural aspects. Therefore, the other structural aspects will not be described.

As FIG. 4 shows, the plate 2 and stem 3 have grooves 2a and 3c, respectively, which are made in their contacting surfaces. A seal ring 4 is fitted in the grooves 2a and 3c. The grooves 2a and 3c are wider than the seal ring 4 in the radial direction. Thus, neither the plate 2 nor the stem 3 will be broken even if the plate 2 and stem 3 change in size with respect to the seal ring 4 due to temperature changes.

The first seal surface 12 is provided at the bottom 2a of the groove 2a made in the plate 2. The second seal surface 13 is provided at the bottom of the groove 3c made in the stem 3. The seal ring 4 contacts the first seal surface 12 and the second seal surface 13 at a part near the outer and inner circumference. The seal ring 4 has a so-called "H cross section." The seal ring 4 contacts the plate 2 in an area smaller than the seal ring 4 of the first embodiment. Thus, the seal ring 4 more reduces the heat being conducted to it from the plate 2, than the seal ring 4 of the first embodiment. Since the plate 2 and stem 3 have grooves 2a and 3c, respectively, they can be more easily aligned than otherwise. This seal ring 4 may be used in the first embodiment.

Figure 5:
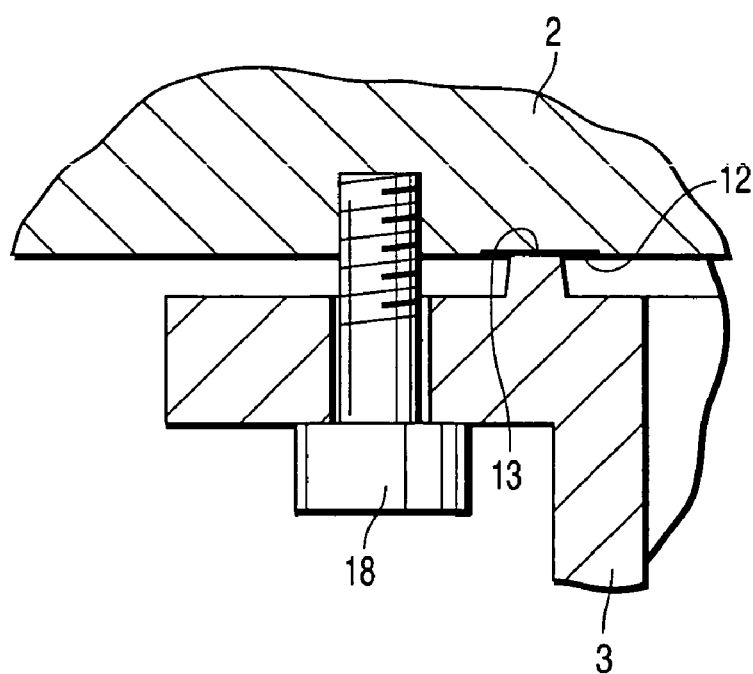
FIG. 5 is a magnified sectional view showing the fitting portion between the plate and stem of a stage according to a third embodiment of the invention.

FIG. 5 depicts the fitting portion between the plate 2 and stem 3 of a stage 1, which is a film-forming apparatus according to the third embodiment of the invention. This stage 1 has no seal rings. The first seal surface 12 formed flat. The second seal surface 13 protrudes toward the first seal surface 12. Alternatively, the second seal surface 13 may be formed flat and the second seal surface 12 may protrude toward the second seal surface 13. If the part to be replaced less often is formed convex and the part to be replaced more often is replaced with a new one, the convex seal surface of the part to be replaced less often may be grinded by matching process. The other structural aspects are identical to those of the first and second embodiments, and will not be described.

In the stage 1 thus configured, the amount of heat propagating from the plate 2 to the stem 3 is small because the plate 2 and the stem 3 contact at a surface of a small area. It is easy for the plate 2 to acquire a stable temperature. Since the plate 2 and the stem 3 contact each other at a surface of a small area, it is easy to perform finishing process on the first and second seal surfaces 12 and 13. This reduces the processing cost.

Figure 6:
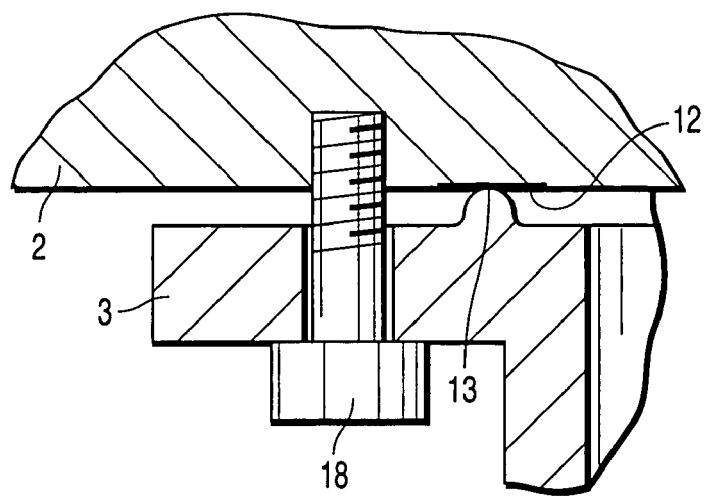
FIG. 6 is a sectional view showing a modification of the plate-stem fitting portion illustrated in FIG. 5.

As FIG. 6 shows, the tip of the second seal surface 13, i.e., the protruding seal surface, is rounded and has an arcuate cross section. In this case, the first seal surface 12 and the second seal surface 13 contact each other at a line. The conduction of heat from the plate 2 to the stem 3 is minimized, and the plate 2 and the stem 3 can more easily fit on each other. Having no seal rings, the state 1 thus configured comprises a few parts and can be made at low cost.

Figure 7:
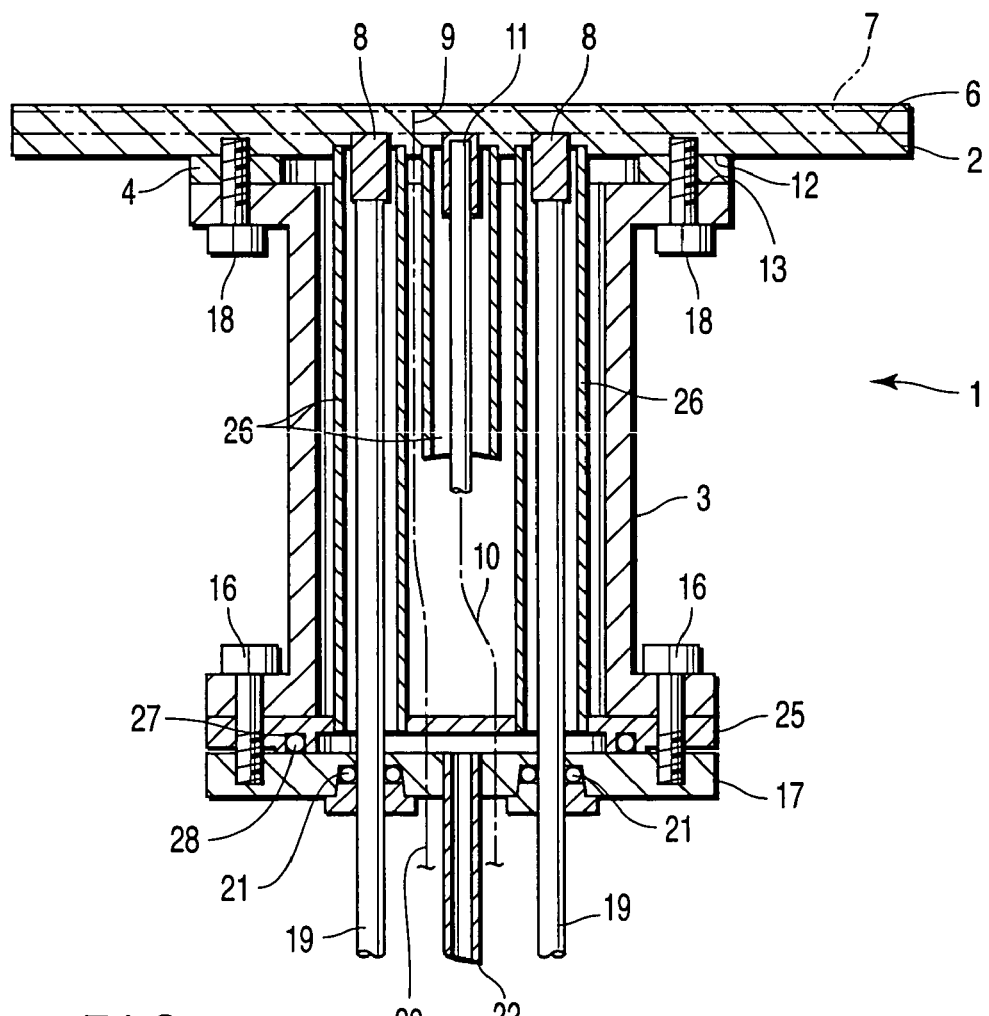
FIG. 7 is a sectional view depicting a stage according to a fifth embodiment of the invention.

FIG. 7 illustrates a stage 1 that is a film-forming apparatus according to the fourth embodiment of the present invention. The components identical in function to those of the stage 1 according to the first embodiment are designated at the same reference numerals and will not be described. The fitting portion between the plate 2 and stem 3 of this stage 1 is illustrated in FIG. 2. The fitting portion between the plate 2 and the stem 3 may be of the type shown in FIG. 4, FIG. 5 or FIG. 6.

Unlike the stage 1 according to the first embodiment, the stage 1 further has a distribution plate 25 and sheaths 26 made of ceramic. The distribution plate 25 is interposed between the stem 3 and the cover 17. It distributes the inert gas supplied from the flow path 22, to the sheaths 26. The sheaths 26 extend between the plate 2 and the distribution plate 25 and covers the terminals 8 and 9, conductors 19 and 20 and thermocouple 10, respectively.

The sheaths 26 are somewhat penetrated into the plate 2 so as to keep a position. The inert gas can leak a little at the fitting portion between the plate 2 and each sheath 26. That part of each sheath 26 which is inserted in the distribution plate 25 is soldered. Alternatively, that part of each sheath 26 which is inserted in the distribution plate 25 may be fitted, not soldered, so that the inert gas may preferentially flow into the sheath 26. The inert gas may not only flow into each sheath 26, but also may positively be led into the stem 3.

The distribution plate 25 has an O-ring groove 27. An O-ring 28 is fitted in the O-ring groove 27 and achieves airtight sealing between the distribution plate 25 and the cover 17. The sheaths 26 that cover the terminal 9 and conductor 20 for the electrode 7 are not illustrated. A part of the sheath 26 for the thermocouple 10 is not shown, either. The inert gas is supplied into the sheaths 26 at a pressure equal to or higher than the pressure in the stem 3.

In the stage 1 thus configured, heat is conducted from the plate 2 to the stem 3 but in s small amount. This helps to stabilize the temperature of the plate 2. Further, the sheaths 26 cover the terminals 8 and 9, conductors 19 and 20 and thermocouple 10, and the inert gas is supplied into the sheaths 26. Therefore, the terminals 8 and 9, conductors 19 and 20 and thermocouple 10 are protected from the process gas. As is desired, the inert gas is consumed only in small quantities.

Another flow path may be provided to discharge gas from the stem 3 toward the cover 17. In this case, the inert gas leaking from the sheaths 26 will not be expelled into the process chamber 5 through the gap between the plate 2 and the stem 3. This maintains the process gas in the process chamber 5 at high purity.

Ceramics used as materials of the plate 2, stem 3, seal ring 4 and screws 18 will be specified. The plate 2 is made of aluminum nitride-based ceramic. The stem 3 is made of alumina-based material. Seal ring 4 is made of magnesia-based ceramic. Other ceramics may be used instead. Among these are as zirconia-based ceramic, silicon nitride-based ceramic, SIALON (Si—Al—O—N)-based ceramic, and titanium nitride-based ceramic.

It is desired that the plate 2, stem 3, seal ring 4, grooves 2a and 3c, and the like be rounded at corners to prevent stresses from concentrating.

In the stage 1 wherein at least one of the first and second seal surfaces 12 and 13 protrudes toward the other, the plate 2 and the stem 3 contact at a surface of a small area. Therefore, heat is conducted from the plate 2 to the stem 3 but in a small amount. Thus, the plate can easily acquire a stable temperature when heated by the heater.

In the stage 1 wherein a seal ring 4, which has a higher resistance to heat conduction than the plate 2 and stem 3, is provided between the first seal surface 12 of the plate 2 and the second seal surface 13 of the stem 3, heat may be conducted from the plate 2 to the stem 3 via the seal ring 4. Hence, the heat is conducted from the plate 2 to the stem 3, but in a small amount.

The stage 1 described above comprises a few components and has a simple structure. Thus, it can be manufactured at low cost.

Additional advantages and modifications will readily occur to those skilled in the art. Therefore, the invention in its broader aspects is not limited to the specific details and representative embodiments shown and described herein. Accordingly, various modifications may be made without departing from the sprint or scope of the general inventive concept as defined by the appended claims and their equivalents.

What is claimed is:

1. A film-forming apparatus comprising:
    a plate which is to be exposed to process gas and has an embedded heater that generates heat by resistance heating;
    a terminal which is exposed at one surface of the plate and supplies power to the heater;
    a first seal surface provided on the plate, shaped like a ring and surrounding the terminal;
    a stem shaped like a hollow cylinder, surrounding the terminal and supporting the plate;
    a second seal surface shaped like a ring and extending along that end of the stem which supports the plate;
    a cover which closes an open end of the stem, which is opposite to the end which supports the plate;
    a conductor passing through the cover into the stem and connected to the terminal;
    a flow path provided in the cover and configured to supply inert gas into the stem; and
    a seal ring interposed between the first and second seal surfaces, said seal ring comprising an inner circumferential part and an outer circumferential part, said inner and outer circumferential parts being in contact with the first and second seal surfaces so that an unattached zone is defined all around between the inner and outer circumferential parts, wherein the seal ring has a cross section formed in an H-shape all around.

2. The film-forming apparatus according to claim 1, wherein the seal ring has a higher resistance to heat conduction than the plate and stem.

3. The film-forming apparatus according to claim 2, further comprising a fastening member which fastens the plate and the stem to each other and which penetrates the seal ring.

4. The film-forming apparatus according to claim 3, wherein the fastening member is made of alumina-based ceramic.

5. The film-forming apparatus according to claim 2, wherein the seal ring is made of alumina-based ceramic.

6. The film-forming apparatus according to claim 2, wherein the seal ring is made of magnesia-based ceramic.

7. The film-forming apparatus according to claim 1, further comprising sheaths provided between the plate and the cover and surrounding the terminal and the conductor, and in which the inert gas is supplied into the sheaths from the flow path.

8. The film-forming apparatus according to claim 1, wherein the plate comprises a high-frequency ground electrode which is embedded in a side opposite to the terminal with respect to the heater.

9. The film-forming apparatus according to claim 1, wherein the plate comprises a temperature-detecting portion which detects a temperature of the heater.

10. The film-forming apparatus according to claim 1, further comprising:
    a high-frequency ground electrode embedded in the plate;
    a terminal connected to the electrode and exposed at the same side as the terminal;
    a high-frequency cable penetrating the cover and connected to the terminal that is connected to the electrode;
    a sheath thermocouple penetrating the cover, inserted in the plate and configured to detect a temperature of the heater; and
    sheaths which surround the terminal connected to the electrode, the high-frequency cable and the sheath thermocouple, and into which the inert gas is supplied from the flow path, the terminal, high-frequency cable and sheath thermocouple being exposed between the plate and the cover.

11. The film-forming apparatus according to claim 1, wherein the inert gas is supplied at a pressure equal to or higher than a pressure of the process gas outside the stem.

12. A film-forming apparatus comprising:
    a plate which is to be exposed to process gas and has an embedded heater that generates heat by resistance heating;
    a terminal which is exposed at one surface of the plate and supplies power to the heater;
    a first seal surface provided on the plate surrounding the terminal;
    a hollow cylinder stem surrounding the terminal, the hollow cylinder stem having a first end and a second end opposite the first end, the first end supporting the plate;
    a second seal surface extending along the first end;
    a cover which closes the second end;
    a conductor passing through the cover into the hollow cylinder stem and connected to the terminal;
    a flow path provided in the cover and configured to supply inert gas into the hollow cylinder stem; and
    a seal ring interposed between the first and second seal surfaces, wherein the seal ring has a cross section formed in an H-shape all around.

13. The film-forming apparatus according to claim 12, wherein the seal ring has a higher resistance to heat conduction than the plate and stem.

* * * * *